US006924229B2

(12) United States Patent
Cheong et al.

(10) Patent No.: US 6,924,229 B2
(45) Date of Patent: Aug. 2, 2005

(54) METHOD FOR FORMING A SEMICONDUCTOR DEVICE WITH A HARD MASK LAYER FORMED OVER A BIT LINE TO PROTECT THE BIT LINE DURING SUBSEQUENT ETCHING STEPS

(75) Inventors: Jung Taik Cheong, Seoul (KR); Sang Do Lee, Gyeonggi-do (KR); Bong Ho Choi, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/608,426

(22) Filed: Jun. 30, 2003

(65) Prior Publication Data

US 2004/0126966 A1 Jul. 1, 2004

(30) Foreign Application Priority Data

Dec. 30, 2002 (KR) ................. 10-2002-0087094

(51) Int. Cl.⁷ ......................................... H01L 21/4757
(52) U.S. Cl. ..................... 438/639; 438/763; 438/791; 438/792
(58) Field of Search ................. 438/639, 761, 438/763, 791, 792

(56) References Cited

U.S. PATENT DOCUMENTS

| 5,387,533 | A |  | 2/1995 | Kim |  |
|---|---|---|---|---|---|
| 5,824,582 | A |  | 10/1998 | Tseng |  |
| 6,010,933 | A |  | 1/2000 | Cherng |  |
| 6,077,743 | A |  | 6/2000 | Chen |  |
| 6,184,081 | B1 |  | 2/2001 | Jeng et al. |  |
| 6,211,091 | B1 | * | 4/2001 | Lien et al. | 438/706 |
| 6,268,280 | B1 | * | 7/2001 | Kohyama | 438/629 |
| 6,436,783 | B1 |  | 8/2002 | Ono et al. |  |
| 6,458,692 | B1 | * | 10/2002 | Kim | 438/639 |
| 2001/0046737 | A1 | * | 11/2001 | Ahn et al. | 438/253 |

* cited by examiner

Primary Examiner—Stephen W. Smoot
(74) Attorney, Agent, or Firm—Heller Ehrman LLP

(57) ABSTRACT

A method for forming a semiconductor device having improved characteristics and reliability by forming a hard mask layer on a bit line to prevent degradation of characteristics of the device in a self-alignment contact process of a storage electrode is disclosed. The hard mask layer utilizes over-hang formed at the upper portion of the bit line so as to provide sufficient protection for the bit line in the subsequent etching processes.

6 Claims, 10 Drawing Sheets

METHOD FOR FORMING A SEMICONDUCTOR DEVICE WITH A HARD MASK LAYER FORMED OVER A BIT LINE TO PROTECT THE BIT LINE DURING SUBSEQUENT ETCHING STEPS

BACKGROUND OF THE INVENTION

1. Field of the Invention

The present invention generally relates to a method for forming a semiconductor device, and more specifically, to a method for forming a semiconductor device having improved characteristics and reliability by forming a hard mask layer on a bit line to prevent degradation of characteristics of the device in a self-alignment contact process of a storage electrode.

2. Description of the Prior Art

In a semiconductor device, a lower conductive layer is interconnected to an upper conductive layer through a contact.

In a contact formation process of a semiconductor device which satisfies a design rule of less than 0.20 µm, since a masking process has a small overlap margin, a self aligned contact ("SAC") process using a nitride film as an etching barrier is employed.

When the line width of a device is larger than 0.14 µm, a hole type SAC is used. When the line width of a device is smaller than 0.14 µm, a method for forming a contact wherein a line-type SAC process is combined with a CMP process is used due to small alignment margin.

FIGS. 1a through 1c are a plane view, a plane SEM photograph, and a cross-sectional SEM photograph taken along the line I—I of FIG. 1b, respectively, illustrating an example of a conventional semiconductor device.

Referring to FIG. 1a, a lower insulating layer (not shown) having a gate electrode (not shown) is formed on a semiconductor substrate (not shown).

Thereafter, the lower insulating layer is etched via a photolithography process using a landing plug contact mask to form a landing plug contact hole exposing an active region of the semiconductor substrate. A polysilicon layer (not shown) filling the landing plug contact hole is formed on the entire surface of the resulting structure, and then planarized to form a landing plug 11. The planarization process is performed using the hard mask layer on the gate electrode as etch barrier layer to form the landing plug 11 connected to the active region between the gate electrodes where a storage electrode or a bit line is to be contacted.

Thereafter, a first interlayer insulating film (not shown) is formed and then etched in a photolithography process using a bit line contact mask to form a bit line contact hole exposing the landing plug 11.

Thereafter, a bit line 13 connected to the landing plug 11 through the bit line contact hole is formed. The bit line 13 has a hard mask layer consisting of a nitride film thereon.

Next, a second interlayer insulating film 15 is formed on the entire surface of the resulting structure. The second interlayer insulating film 15 and the first interlayer insulating film are etched in a photolithography process using a storage electrode contact mask (not shown) to form a storage electrode contact hole 17 exposing the landing plug 11. A storage electrode contact plug connected to the landing plug 11 through the storage electrode contact hole 17 is then formed.

FIG. 1b is a SEM photograph illustrating a plane view of the storage electrode contact hole 17. "a" and "b" represent a bottom critical dimension CD and a top critical dimension CD of the storage electrode contact hole 17, respectively. As shown in FIG. 1b, "b" is larger than "a".

FIG. 1c is a cross-sectional SEM photograph taken along the line I—I of FIG. 1b. As shown in FIG. 1c, "b" is larger than "a".

FIGS. 2a through 2c are a plane diagram, a plane SEM photograph, a cross-sectional SEM photograph taken along the line II—II and III—III of FIG. 2a, respectively, illustrating another example of a conventional semiconductor device. FIGS. 2a through 2c illustrate a semiconductor device formed via the combination of a line-type SAC process and a CMP process to obtain sufficient alignment margin in contrary to FIG. 1a.

Referring to FIG. 2a, a lower insulating layer (not shown) having a gate electrode (not shown) is formed on a semiconductor substrate (not shown).

Thereafter, the lower insulating layer is etched via a photolithography process using a landing plug contact mask to form a landing plug contact hole exposing an active region of the semiconductor substrate. A polysilicon layer (not shown) filling the landing plug contact hole is formed on the entire surface of the resulting structure, and then planarized to form a landing plug 21. The planarization process is performed using the hard mask layer on the gate electrode as etch barrier layer to form the landing plug 21 connected to the active region between the gate electrodes where a storage electrode or a bit line is to be contacted.

Thereafter, a first interlayer insulating film (not shown) is formed and then etched in a photolithography process using a bit line contact mask to form a bit line contact hole exposing the landing plug 21.

Thereafter, a bit line 23 connected to the landing plug 21 through the bit line contact hole is formed. The bit line 23 has a hard mask layer consisting of a nitride film thereon.

Next, a second interlayer insulating film 25 is formed on the entire surface of the resulting structure. The second interlayer insulating film 25 and the first interlayer insulating film are etched in a photolithography process using a line-type storage electrode contact mask (not shown), which is perpendicular to the bit line 23, to form a storage electrode contact hole 27 exposing the landing plug 21. The storage electrode contact hole 27 exposes a portion of the landing plug 21 at the crossing of the bit line 23, the line-type second interlayer insulating film 25 and the first interlayer insulating film.

Thereafter, a storage electrode contact plug connected to the landing plug 21 through the storage electrode contact hole 27 is formed.

FIG. 2b is a plane SEM photograph of FIG. 2a. In FIG. 2b, the contact holes are aligned on the contrary to FIG. 1b. "c" and "d" represent a bottom CD and a top CD of the storage electrode contact hole 17. As shown in FIG. 2b, "d" is larger than "c".

FIG. 2c is a SEM photograph illustrating a hard mask layer e for a bit line and a bit line formed thereunder.

A gate electrode f, a landing plug g, a first interlayer insulating film h, and a second interlayer insulating film I are illustrated in FIG. 2d. However, a bit line is not shown.

FIGS. 3a through 3e are cross-sectional SEM photographs illustrating a conventional method for forming a semiconductor device.

Referring to FIG. 3a, a lower insulating layer (not shown) having a gate electrode (not shown) is formed on a semiconductor substrate (not shown).

Thereafter, the lower insulating layer is etched via a photolithography process using a landing plug contact mask to form a landing plug contact hole exposing an active region of the semiconductor substrate. A polysilicon layer (not shown) filling the landing plug contact hole is formed on the entire surface of the resulting structure, and then planarized to form a landing plug 31. The planarization process is performed using the hard mask layer on the gate electrode as etch barrier layer to form the landing plug 31 connected to the active region between the gate electrodes where a storage electrode or a bit line is to be contacted. The height of the hard mask layer is j.

Thereafter, a first interlayer insulating film (not shown) is formed and then etched in a photolithography process using a bit line contact mask to form a bit line contact hole exposing the landing plug 31.

Thereafter, a bit line 33 connected to the landing plug 31 through the bit line contact hole is formed. The bit line 33 has a hard mask layer consisting of a nitride film thereon.

Referring to FIG. 3b, a nitride film spacer is formed on a sidewall of the bit line 33. The nitride film spacer is formed by depositing a nitride film having a thickness ranging from 250 to 350 Å on the entire surface of the resulting structure and then anisotropically etching the nitride film. In the etching process, the nitride film is over-etched by 500 to 600 Å, and the thickness of the hard mask layer on the bit line 33 is decreased from j to k due to the over-etching.

Referring to FIG. 3c, a second interlayer insulating film (not shown) is formed on the entire surface of the resulting structure. The second interlayer insulating film and the first interlayer insulating film are etched in a photolithography process using a line-type storage electrode contact mask (not shown), which is perpendicular to the bit line 33, to form a storage electrode contact hole (not shown) exposing the landing plug 31. The storage electrode contact hole exposes a portion of the landing plug 31 at the crossing of the bit line 33, the line-type second interlayer insulating film and the first interlayer insulating film.

Thereafter, a polysilicon layer (not shown) filling the storage electrode contact hole is formed on the entire surface of the resulting structure, and then planarized to form a storage electrode contact plug 35 connected to the landing plug 31 through the storage electrode contact hole.

The planarization process is a CMP (Chemical Mechanical Polishing) process. "A" denotes a planarized state. Since the hard mask layer on the bit line 33 is etched in the CMP process, the thickness of the hard mask layer is decreased from k to l. As a result, an insulating characteristic of the bit line 33 is degraded.

Referring to 3d, a storage electrode 37 connected to the storage electrode contact plug 35 is formed in a subsequent process. Since the interval m between the bit line 33 and the storage electrode 37 becomes smaller, the margin for maintaining the insulating characteristic is decreased.

FIG. 3e illustrates a contact hole formed by performing a wet-etching process and subsequent processes to enlarge bottom CD of the contact hole as shown in FIGS. 1b and 2b. A groove n is formed at the lower portion of the bit line by the wet-etching process, and the material used for the formation of the storage electrode contact plug 35 is filled therein, which degrades the characteristics of a device.

As described above, in the conventional method for forming a semiconductor device, the hard mask layer of the bit line is damaged due to an excessive CMP performed to isolate contact plugs in the CMP process for forming a line-type contact plug, thereby degrading characteristics of a device.

Specifically, since a pattern density or a polishing degree in each wafer is not uniform, when the storage electrode contact plugs are isolated on the entire surface of a wafer, bit lines in certain regions are exposed. When a capacitor is formed in a subsequent process, short between the capacitor and the bit line occurs.

In the SAC process performed in the second example, the possibility of the SAC defects, which are connection defects between conductive layers, generated due to the damages in nitride films are much larger than that of the first example. When the thickness of the nitride film is increased to overcome the problem, voids can be generated, thereby degrading characteristics of a device.

SUMMARY OF THE INVENTION

It is an object of the present invention to provide a method for forming a semiconductor device wherein a hard mask layer utilizing over-hang formed at the upper portion of the bit line so as to provide sufficient protection for the bit line in the subsequent etching processes.

A method for forming a semiconductor device, comprising the steps of: (a) forming a lower insulating layer comprising a landing plug on a semiconductor substrate; (b) forming an interlayer insulating film on the entire surface of the resulting structure; (c) forming a bit line on the interlayer insulating film, wherein the bit line has a hard mask layer thereon and a nitride spacer on a sidewall thereof; (d) forming a storage electrode contact hole exposing a upper portion of the landing plug; (e) forming a first nitride film on the entire surface of the resulting structure; (f) forming a second nitride film on the entire surface of the resulting structure, wherein the thickness of the second nitride film disposed at the bottom and on the inner walls of the storage electrode contact hole smaller than that of the second nitride film on an upper portion of the hard mask layer; and (g) etching the second nitride film and the first nitride film to expose the landing plug is provided.

DETAILED DESCRIPTION OF THE PREFERRED EMBODIMENTS

The present invention will be explained in detail referring to the accompanying drawings.

FIGS. 4a through 4d are cross-sectional diagrams illustrating a method for forming a semiconductor device according to the present invention, wherein the thickness of the nitride film is limited to a predetermined value according to the embodiment.

Figure 4A:
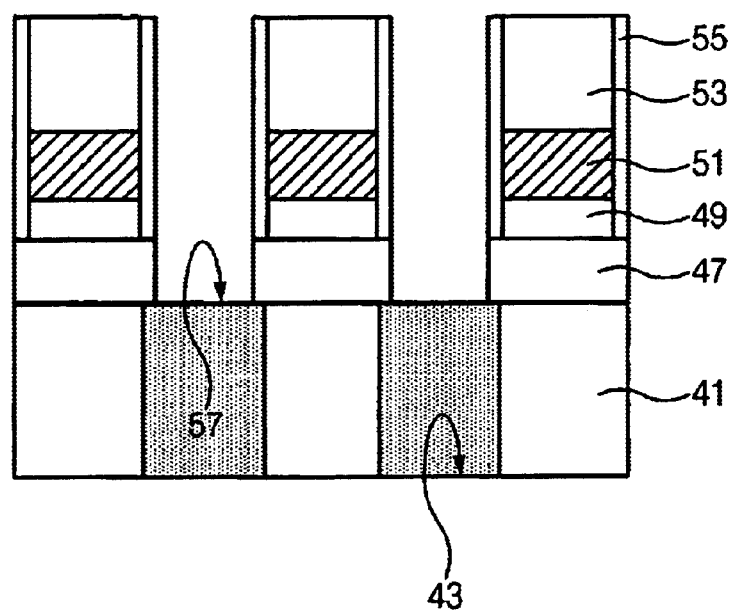
FIGS. 4a through 4c are cross-sectional diagrams illustrating a method for forming a semiconductor device according to the present invention.

Referring to FIG. 4a, a lower insulating layer 41 having a gate electrode (not shown) is formed on a semiconductor substrate (not shown).

Thereafter, the lower insulating layer 41 is etched via a photolithography process using a landing plug contact mask (not shown) to form a landing plug contact hole 43 exposing an active region of the semiconductor substrate. A polysilicon layer (not shown) filling the landing plug contact hole 43 is formed on the entire surface of the resulting structure, and then planarized to form a landing plug. The planarization process is performed using the hard mask layer on the gate electrode as etch barrier layer to form the landing plug connected to the active region between the gate electrodes where a storage electrode or a bit line is to be contacted.

Thereafter, a first interlayer insulating film 47, a second interlayer insulating film (not shown), a conductive layer (not shown) for a bit line, and a hard mask layer (not shown) are sequentially formed. The first interlayer insulating film 47 and the second interlayer insulating film consist of the same material. However, the first interlayer insulating film 47 and the second interlayer insulating film are shown as two layers to illustrate a step coverage generated during the formation of a bit line, and a step coverage generated during the etching of a storage electrode contact hole.

Next, the hard mask layer, the conductive layer for a bit line and the second interlayer insulating film are patterned to form a stacked structure of a hard mask layer pattern 53, a conductive layer pattern 51 for a bit line and a second interlayer insulating film pattern 49.

Thereafter, a nitride film spacer 55 is formed on a sidewall of the stacked structure. The nitride spacer 55 is preferably formed by depositing a nitride film (not shown) on the entire surface of the resulting structure and anisotropically etching the nitride film.

Next, a third interlayer insulating film (not shown) is deposited on the entire surface of the resulting structure. The third insulating film and the first interlayer insulating film are etched using a storage electrode contact mask (not shown) to form a storage electrode contact hole 57 exposing the landing plug.

Figure 4B:
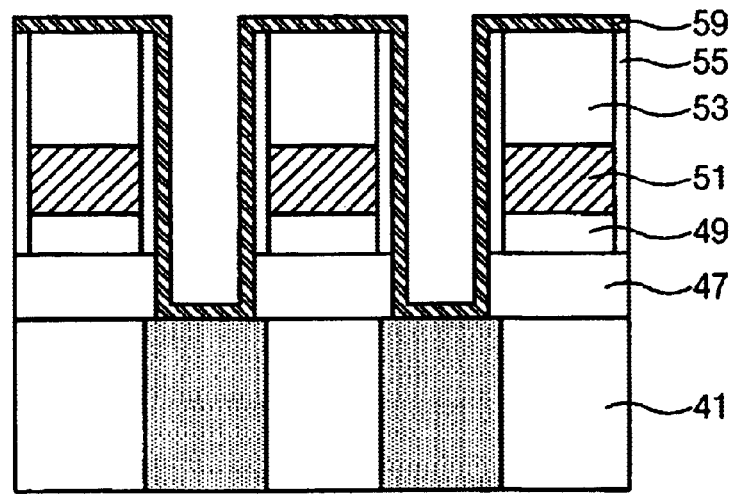

Referring to FIG. 4b, a first nitride film 59 having a predetermined thickness is formed on the entire surface of the resulting structure including the storage electrode contact hole 57. Preferably, the first nitride film 59 has a step coverage ranging from 85 to 100%, and more preferably higher than 95%. The thickness of the first nitride film 59 ranges from 10 to 200 Å, preferably 10 to 50 Å. The first nitride film 59 is preferably deposited via a LPCVD method.

Figure 4C:
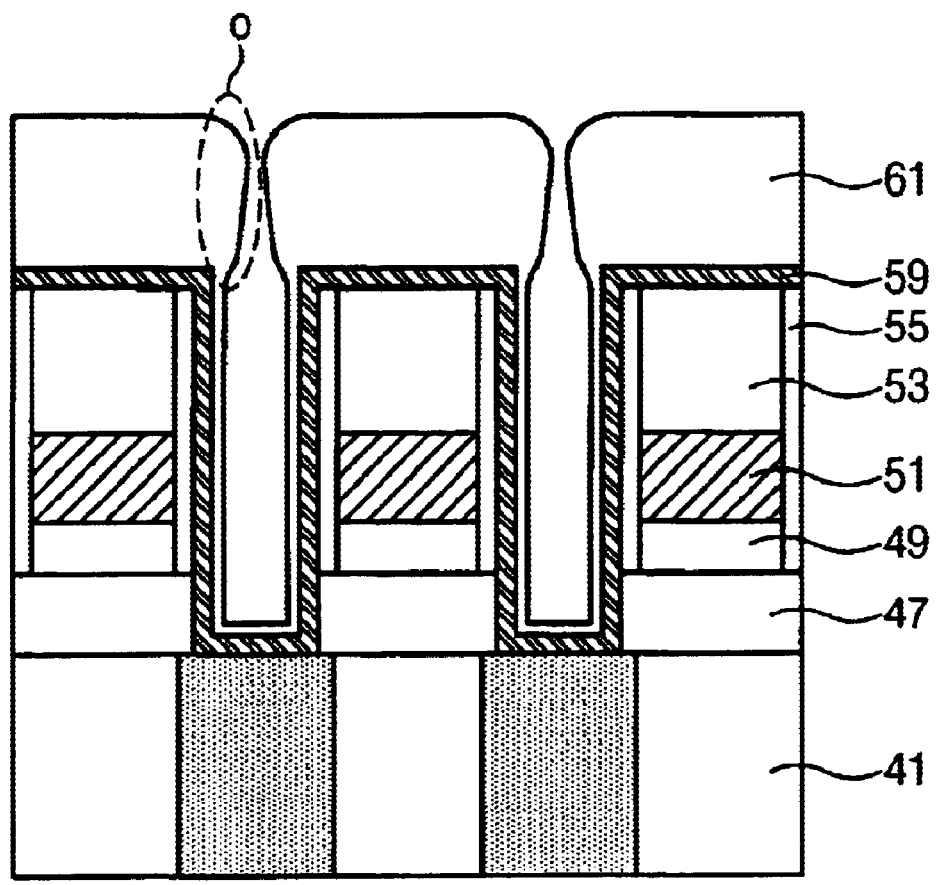

Referring to FIG. 4c, a second nitride film 61 is formed on the entire surface of the resulting structure. Preferably, the second nitride film 61 has a step coverage ranging from 5 to 40%, and deposited via a PECVD method. The thickness of a portion of the second nitride film 61 on the stacked structure comprising the bit line 51 preferably ranges from 500 to 3000 Å, and more preferably 550 to 650Å. The thickness of the second nitride film 61 on the inner walls and at the bottom of the storage electrode contact hole 57 ranges from 100 to 240 Å so that the thickness of the stacked structure of the first nitride film 59 and the second nitride film 61 at the bottom of the contact hole 57 ranges from 150 to 250 Å. The second nitride film 61 generates an over-hang, which is denoted as "o" in FIG. 4c.

Preferably, the first nitride film and the second nitride film may be sequentially formed in one chamber wherein the ratio of $SiH_4$ to $NH_3$ is varied by increasing $SiH_4$.

Figure 4D:
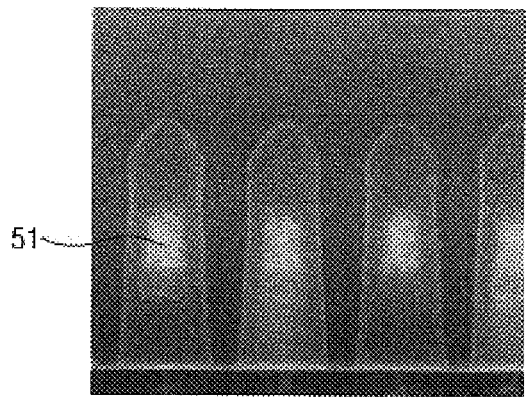
FIG. 4d is a SEM photograph illustrating a semiconductor device formed in a subsequent process of FIG. 4c.

Referring to FIG. 4d, an etching process is performed to remove the over-hang and the second nitride film 61 at the bottom of the storage electrode contact hole 57 to expose the landing plug.

An Ar sputtering step performed in a dry plasma chamber may be added to the etching process, to remove the over-hang.

The thickness of the layers etched in the etching process in order to completely remove the second nitride film 61 at the bottom of the storage electrode contact hole 57 ranges from 450 to 550 Å. The nitride film in the stacked structure comprising the bit line 51 serves to thicken the thickness of the hard mask layer 53 by 100 Å.

Figure 1A:
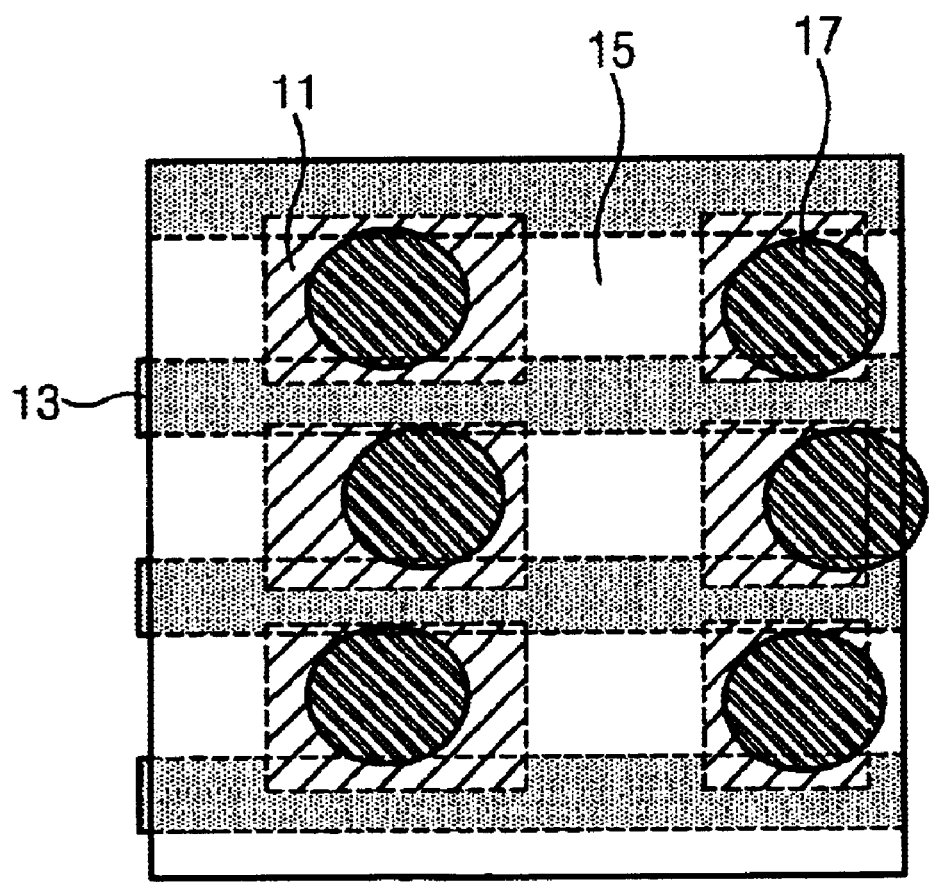
FIGS. 1a through 1c are a plane view, a plane SEM photograph, and a cross-sectional SEM photograph taken along the line I—I of FIG. 1b, respectively, illustrating an example of a conventional semiconductor device.
Figure 1B:
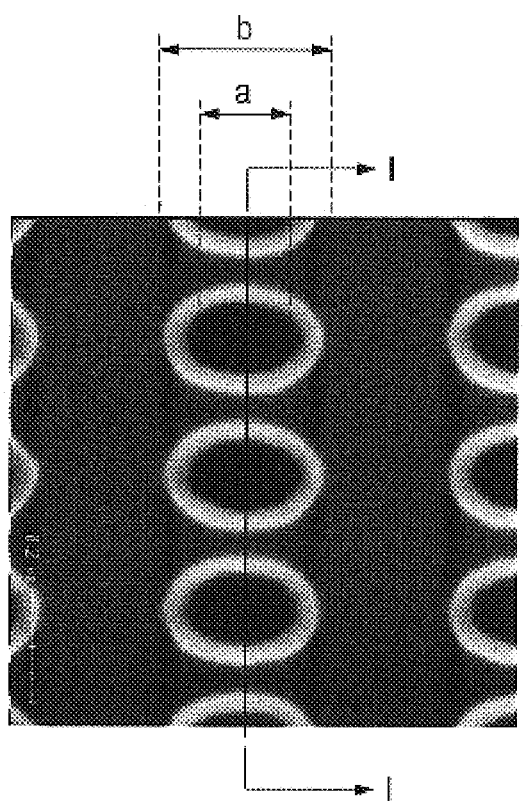
Figure 1C:
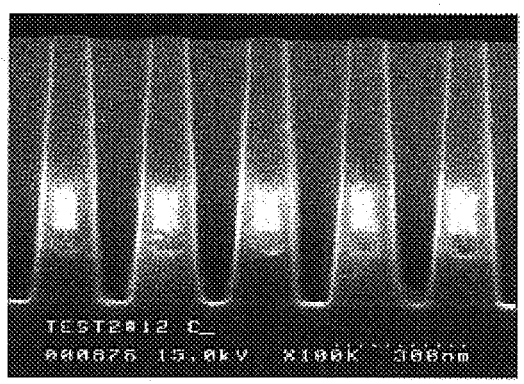
Figure 2A:
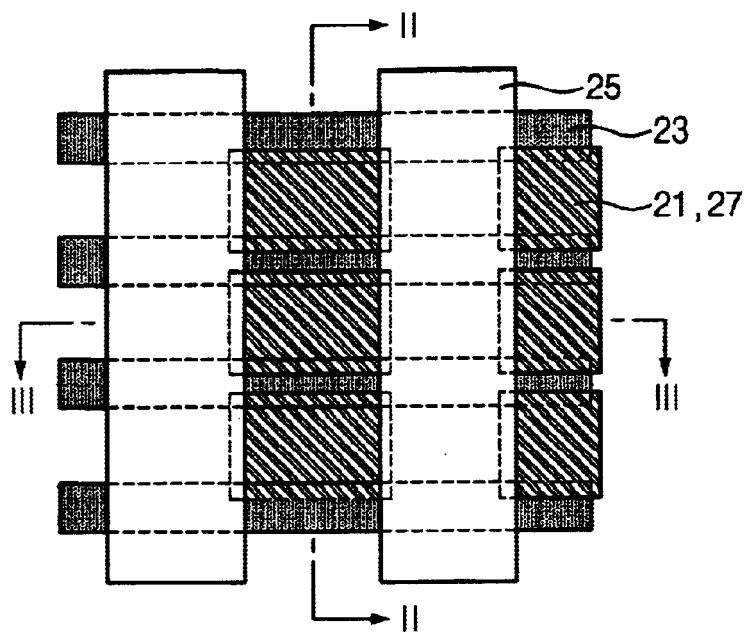
FIGS. 2a through 2c are a plane diagram, a plane SEM photograph, a cross-sectional SEM photograph taken along the line II—II and III—III of FIG. 2a, respectively, illustrating another example of a conventional semiconductor device.
Figure 2B:
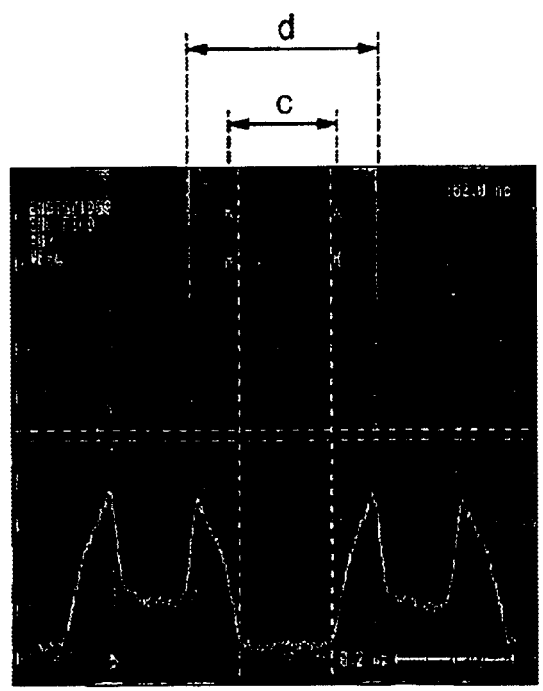
Figure 2C:
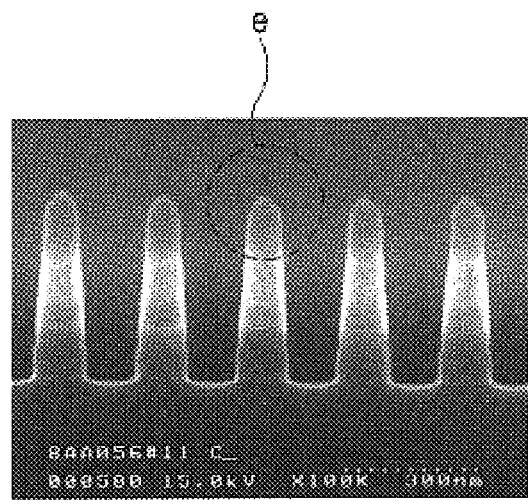
Figure 2D:
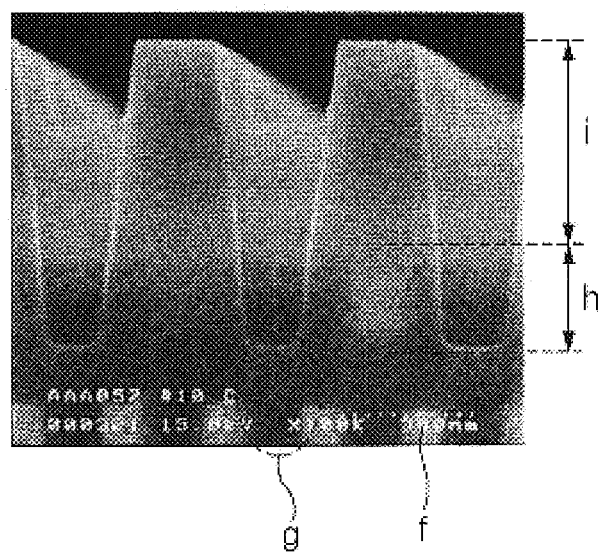
FIG. 2d shows a gate electrode f, a landing plug g, a first interlayer insulating film h, and a second interlayer insulating film I.
Figure 3A:
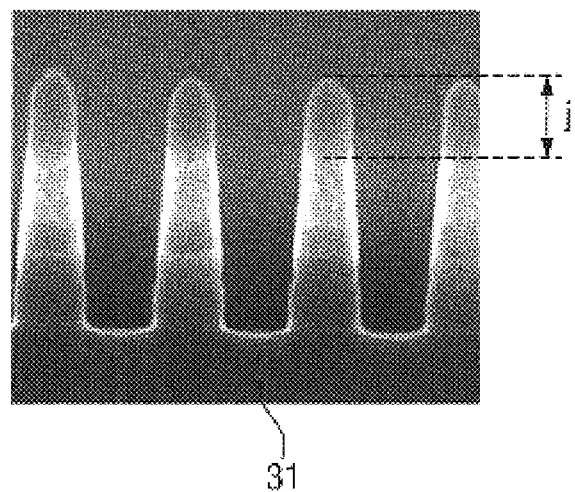
FIGS. 3a through 3e are cross-sectional SEM photographs illustrating a conventional method for forming a semiconductor device.
Figure 3B:
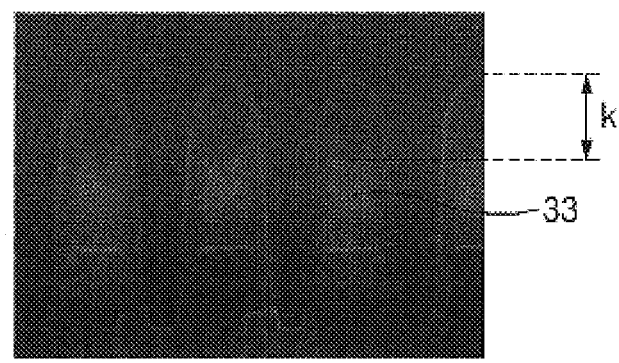
Figure 3C:
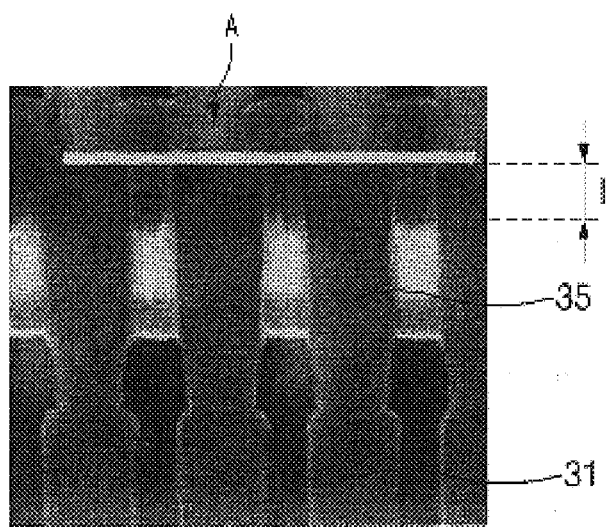
Figure 3D:
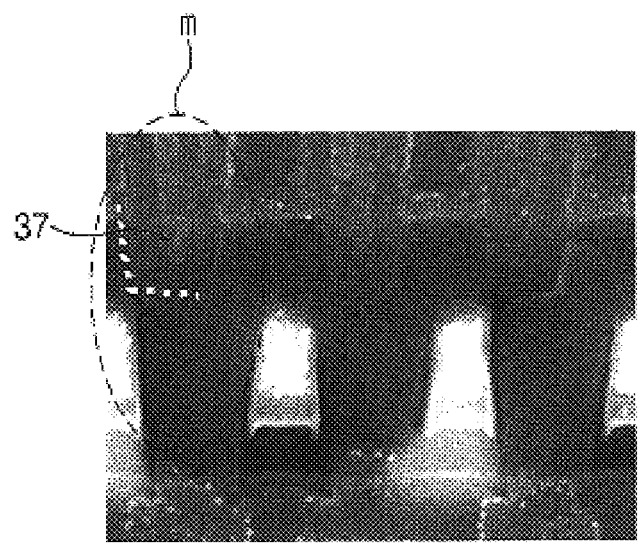
Figure 3E:
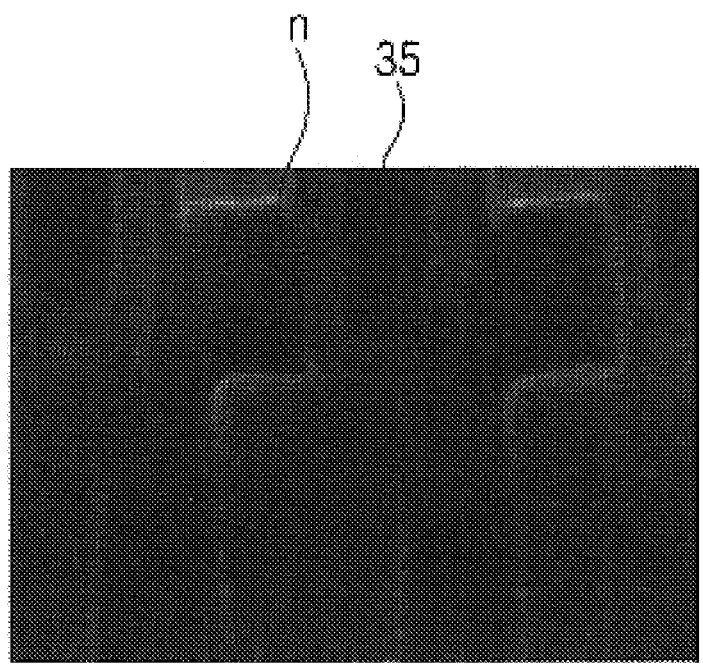

In the conventional method described in FIG. 3b, the nitride film spacer is formed by depositing a nitride film having a thickness ranging from 250 to 350 Å on the entire surface of the resulting structure and then 450 to 650 Å of the nitride film is anisotropically etched. When the present invention is compared with the conventional method, the present invention has an effect of increasing the thickness of the hard mask layer 53 by 250 to 450 Å.

Figure 4E:
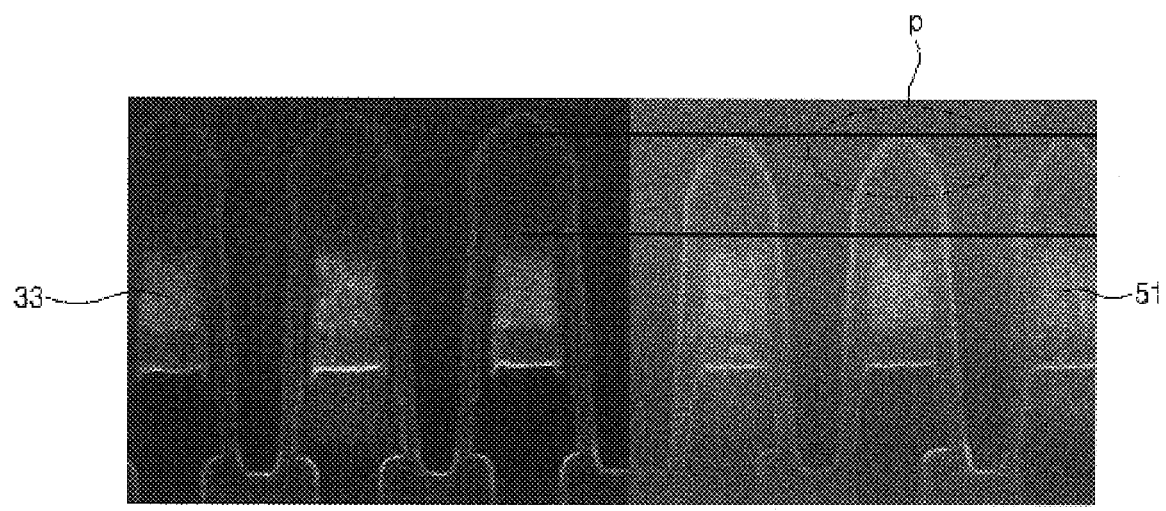
FIG. 4e is a SEM photograph illustrating a comparison of the conventional semiconductor device and a semiconductor device according to the present invention.

FIG. 4e is a SEM photograph illustrating a comparison of the conventional semiconductor device and a semiconductor device according to the present invention.

Referring to FIG. 4e, the photograph on the left shows the thickness of the nitride film formed on the bit line 33 according to the conventional method, and the photograph on the right shows the thickness of the nitride film formed on the bit line 51 of the semiconductor device according to the present invention. As shown in FIG. 4e it should be noted that the thickness of the nitride film on the bit line 51 of the semiconductor device according to the present invention is thicker than that of the nitride film according to the conventional method (denoted by "p").

As discussed earlier, according to the method for forming a semiconductor device of the present invention, a nitride film consisting of the same material as the hard mask layer is deposited on a stacked structure of a hard mask layer and a bit line to obtain an etching margin in a subsequent etching process, thereby preventing the degradation of the insulating characteristic of a storage electrode including a storage electrode contact plug and a lower conductive layer.

What is claimed is:

1. A method for forming a semiconductor device, comprising the steps of:
   (a) forming a lower insulating layer comprising a landing plug on a semiconductor substrate;
   (b) forming an interlayer insulating film on the entire surface of the resulting structure;
   (c) forming a bit line on the interlayer insulating film, wherein the bit line has a hard mask layer thereon and a nitride spacer on a sidewall thereof;
   (d) forming a storage electrode contact hole through the interlayer insulating film to expose an upper portion of the landing plug;
   (e) forming a first nitride film on the entire surface of the resulting structure;
   (f) forming a second nitride film on the entire surface of the resulting structure, wherein the thickness of the second nitride film disposed at the bottom and on the inner walls of the storage electrode contact hole are smaller than that of the second nitride film on an upper portion of the hard mask layer; and (g) etching the second nitride film and the first nitride film to expose the landing plug.

2. The method according to claim 1, wherein the first nitride film has a step coverage ranging from 85 to 100% and is deposited in a LPCVD process.

3. The method according to claim 1, wherein the thickness of the first nitride film ranges from 10 to 200 Å.

4. The method according to claim 1, wherein the second nitride film has a step coverage ranging from 5 to 40% and is formed in a PECVD process.

5. The method according to claim 1, wherein the thickness of the second nitride film formed on the upper portion of the hard mask layer ranges from 500 to 3000 Å.

6. The method according to claim 1, wherein the first nitride film and the second nitride film are continuously formed in the same chamber by varying the flow rate of $NH_3$ and $SiH_4$ so as to gradually increase the ratio of $SiH_4$.

* * * * *